(12) United States Patent
Kimura et al.

(10) Patent No.: US 7,532,485 B2
(45) Date of Patent: May 12, 2009

(54) MULTILAYER MODULE AND METHOD OF MANUFACTURING THE SAME

(75) Inventors: Junichi Kimura, Aichi (JP); Kazuhiko Honjo, Gifu (JP); Eiji Kawamoto, Osaka (JP); Shinji Harada, Gifu (JP); Motoyoshi Kitagawa, Gifu (JP)

(73) Assignee: Panasonic Corporation, Osaka (JP)

( * ) Notice: Subject to any disclaimer, the term of this patent is extended or adjusted under 35 U.S.C. 154(b) by 206 days.

(21) Appl. No.: 11/435,716

(22) Filed: May 18, 2006

(65) Prior Publication Data
US 2006/0261472 A1    Nov. 23, 2006

(30) Foreign Application Priority Data
May 20, 2005    (JP)    ............... 2005-147865

(51) Int. Cl.
*H05K 1/14* (2006.01)
(52) U.S. Cl. ...................... 361/794; 361/735
(58) Field of Classification Search ................. 361/735, 361/794
See application file for complete search history.

(56) References Cited

U.S. PATENT DOCUMENTS

| | | | | |
|---|---|---|---|---|
| 6,042,936 A | * | 3/2000 | Kempf | ................ 428/323 |
| 6,910,637 B2 | * | 6/2005 | Hsieh et al. | ............ 235/492 |
| 2003/0042564 A1 | * | 3/2003 | Taniguchi et al. | ........... 257/438 |
| 2004/0145044 A1 | * | 7/2004 | Sugaya et al. | ............... 257/698 |
| 2004/0188855 A1 | * | 9/2004 | Nishimura et al. | .......... 257/777 |
| 2007/0045788 A1 | * | 3/2007 | Suzuki et al. | ............... 257/666 |
| 2008/0012126 A1 | * | 1/2008 | Dozen et al. | ................ 257/729 |

FOREIGN PATENT DOCUMENTS

| | | |
|---|---|---|
| JP | 2000-183283 | 6/2000 |
| JP | 2003-31954 | 1/2003 |

* cited by examiner

*Primary Examiner*—Dean A. Reichard
*Assistant Examiner*—Yuriy Semenenko
(74) *Attorney, Agent, or Firm*—Wenderoth, Lind & Ponack, L.L.P.

(57) ABSTRACT

A multilayer module includes a parts-containing module whose circuit board has been mounted at one surface with an electronic component and the electronic component is covered with a resin layer. Connection terminals are provided either at the resin layer or at the other surface of the circuit board, and a through hole is provided for connection between the two surfaces of the module. Also included is a module, which is provided with connection terminals at a place corresponding to the connection terminal, and the through hole for connection between the connection terminals and electronic component. An insulation layer is disposed between conductor layers, the insulation layer having a conductive bond for connection between connection terminals, respectively. Locations of a through hole and an electronic component in the module are not restricted by a location of the through hole.

21 Claims, 9 Drawing Sheets

MULTILAYER MODULE AND METHOD OF MANUFACTURING THE SAME

TECHNICAL FIELD

The present invention relates to a multilayer module formed of a plurality of modules stacked.

BACKGROUND ART

A conventional multilayer module is described with reference to the drawings.

FIG. 12 shows a cross sectional view of a conventional multilayer module. Referring to FIG. 12, circuit board 300 is a multilayer substrate, conductor pattern 400 is provided on upper surface 300a of circuit board 300, electronic component 200a such as a semiconductor device chip, chip component, etc. is mounted on conductor pattern 400. At bottom surface 300b of circuit board 300, conductor pattern 500 is provided.

Resin layer 600 is provided on upper surface 300a of circuit board 300, in a manner to cover the outer surface of electronic component 200a. Conductor pattern 700 is provided on upper surface 600a of resin layer 600. Conductor pattern 700a disposed on upper surface 600a of resin layer 600 and conductor pattern 500a disposed at bottom surface 300b of circuit board 300 are connected by means of through hole 800 which is penetrating both circuit board 300 and resin layer 600.

In addition, a semiconductor device chip, a chip component or the like electronic components 200b are mounted on conductor pattern 700. Resin layer 900 is provided on upper surface 600a of resin layer 600 covering electronic component 200b. Conductor pattern 1000 is provided on upper surface 900a of resin layer 900. In order to connect conductor pattern 1000a formed at upper surface 900a of resin layer 900 with conductor pattern 700b formed at upper surface 600a of resin layer 600, through hole 1300 is provided penetrating both resin layer 600 and resin layer 900. Through hole 1300 is connected also with conductor pattern 500b at the bottom surface 300b side of circuit board 300.

Multilayer module 120 thus constituted is further provided with conductor patterns 500c and 1000b on bottom surface 300b of circuit board 300 and upper surface 900a of resin layer 900, respectively, at the neighborhood of an outer circumference. These conductor patterns 500c and 1000b are connected by means of through hole 1300 formed at the side wall of multilayer module 1200. Conductor pattern 500c and through hole 1300 are used as the connection terminal for mounting multilayer module 1200 on a mother board.

Now a method of manufacturing the above-configured conventional multilayer module is described with reference to the drawings.

FIG. 13 is a manufacturing flow chart of a conventional multilayer module.

At parts mounting step S21a in FIG. 13, semi-finished electronic component, chip component 200a is mounted on upper surface 300a of circuit board 300, which circuit board being introduced to the work stage for a plurality in the connected state. At resin layer forming step S22a, resin is supplied on upper surface 300a of circuit board 300 to cover semi-finished electronic component, chip component 200a which was mounted at step S21a. The resin is heated and cured. After resin layer 600 is formed at step S22a, a copper foil is bonded on upper surface 600a of resin layer 600, at conductor layer forming step S23a.

At terminal and pattern forming step S24a, the conductive foil is formed into a certain specified pattern 700, 700a by etching or the like process. Through hole 800 is also provided for connection between conductor patterns 700a and 500a. This completes a first layer of multilayer module 1200.

For the second and subsequent layers, those steps from parts mounting step S21b up to terminal and pattern forming step S24b are repeated, like in the first layer making, for a number of resin layers stacked. After internal connections are completed at terminal and pattern forming step S24b making it a finished multilayer module 1200, circuit board 300 and resin layers 600, 900 are cut altogether into individual pieces at separating step S25.

Prior arts related to the present invention are disclosed in, for example, Japanese Patent Unexamined Publication No. 2000-183283, Japanese Patent Unexamined Publication No. 2003-31954.

In an above-configured conventional multilayer module, however, through hole 1300 for connecting conductor pattern 1000a with conductor pattern 700b is formed after resin layer 600 and resin layer 900 are stacked one after the other on circuit board 300. As a result, the through hole penetrates both of resin layers 600 and 900. Therefore, semi-finished electronic component, chip component 200a can not be disposed in a place where there is through hole 1300. This means that the area in which no electronic component can be mounted due to a through hole further increases along with the increasing number of stacked resin layers. Furthermore, since through hole 800 is penetrating resin layer 600 through, no semi-finished electronic component, chip component 200a can be mounted on the area of through hole.

As described in the above, the non-mountable area for electronic component in a conventional multilayer module is caused by through holes 800, 1300 provided for interlayer connections. A problem with the conventional configuration is that it makes multilayer modules larger in size.

SUMMARY OF THE INVENTION

The present invention aims to solve the above problem, and offers multilayer modules in compact sizes regardless of the number of resin layers contained.

A multilayer module in the present invention is formed of a first module which includes a first circuit board and a first electronic component mounted on one of the surfaces of the first circuit board, and a second module stacked and connected on the first module, which second module including a second circuit board and a second electronic component mounted on one of the surfaces of the second circuit board. The first module further includes a first resin layer disposed on the one surface of first circuit board to cover the first electronic component, a first conductor layer disposed either on the first resin layer or on the other surface of first circuit board, a first connection terminal provided on the first conductor layer, a second conductor layer formed on the surface that is opposite to the first conductor layer, and a through hole for connecting the second conductor layer with the first conductor layer. The second module further includes a third conductor layer disposed opposed to the first conductor layer, a second connection terminal provided on the third conductor layer at a place corresponding to the first connection terminal, and a connection conductor for connection between the second connection terminal and the second electronic component.

Furthermore, a multilayer module in the present invention is provided with an insulation layer disposed between the first conductor layer and the third conductor layer, and a connection member for connecting the first connection terminal with the second connection terminal. The first module and the second module have their respective cut end faces at the outer circumference, which cut end faces being aligned on a straight line.

In the above-described structure, location of the connection conductor in the second module for connection between the second connection terminal and the electronic component, as well as location of the electronic component, are not restricted by a place where through hole is located in the first module. Therefore, a restricted area where no electronic component can be mounted due to a through hole can be made smaller; so, a number of electronic components can be mounted densely. As a result, multilayer modules can be made smaller in their sizes.

DETAILED DESCRIPTION OF PREFERRED EMBODIMENTS

First Exemplary Embodiment

A first exemplary embodiment of the present invention is described with reference to the drawings.

Figure 1:
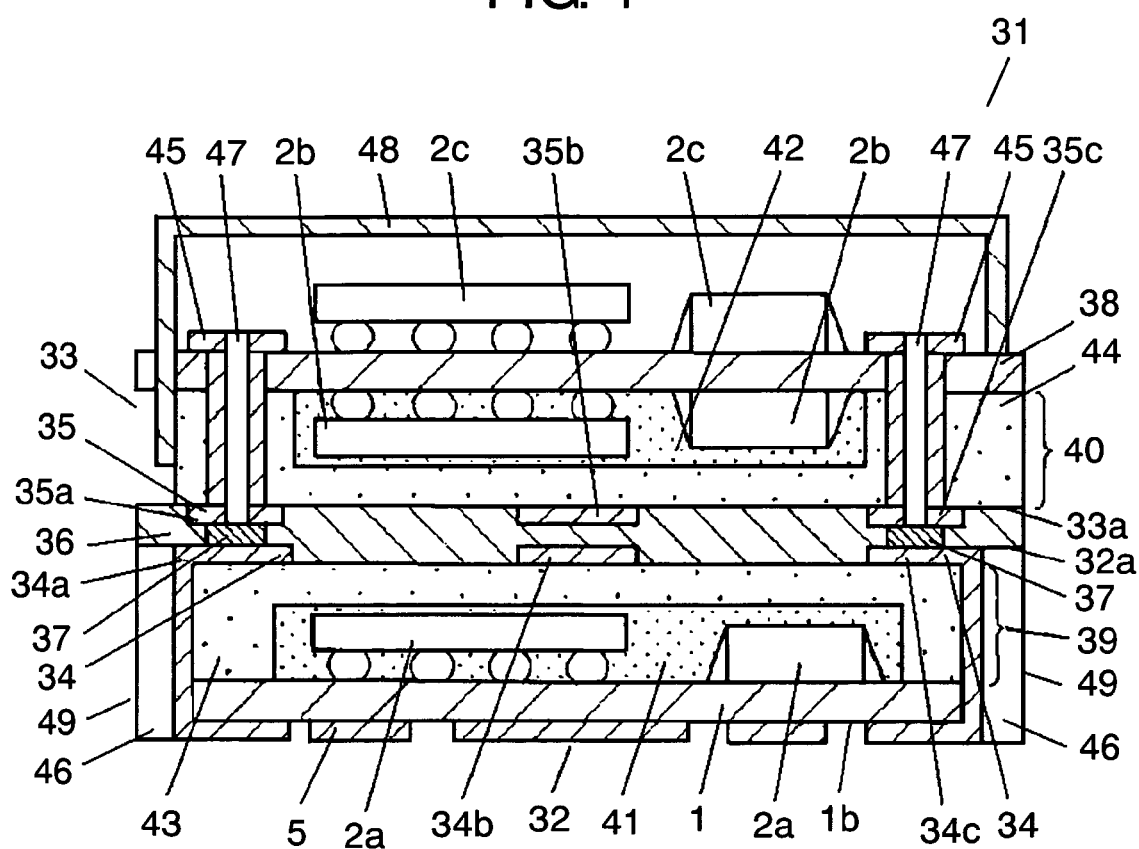
FIG. 1 A cross sectional view of a multilayer module in accordance with a first exemplary embodiment of the present invention.

FIG. 1 is a cross sectional view of a multilayer module in accordance with a first embodiment of the present invention. In FIG. 1, multilayer module 31 in the first embodiment is formed of module 32 (first module) and module 33 (second module) stacked on module 32. Conductor pattern 34 (first conductor layer) provided on upper surface 32a of module 32 opposes conductor pattern 35 (third conductor layer) provided on bottom surface 33a of module 33, with insulation layer 36 in between. An epoxy resin having a hardening property is used for insulation layer 36. Insulation layer 36 uses a glass cloth as the base material at the center, in order to improve the bending strength of multilayer module 31.

Each of conductor patterns 34 and 35 is provided with connection terminal 34a (first connection terminal), 34b and 35a (second connection terminal), 35b, respectively. The counterpart connection terminals 34a/35a and 34b/35b of modules 32 and 33 are disposed at corresponding locations, and connected by conductive bond 37 (connection member). Although an electro conductive resin is used for the connection member in the present embodiment, a thermosetting conductive paste or the like materials may be used instead.

Now, the structure of modules 32, 33 is described. Circuit board 1 (first circuit board), circuit board 38 (second circuit board) of modules 32, 33 are multilayer substrates. Upper surface 1a, 38a and bottom surface 1b, 38b of these multilayer substrates 1, 38, as well as inner conductor layers (not shown) within multilayer substrates 1, 38, have already been connected as specified by means of their respective through holes (not shown), conductive bonds (not shown), etc.

Each of circuit boards 1 and 38 of modules 32 and 33 is mounted with electronic component 2a (first electronic component) and electronic component 2b (second electronic component), respectively, such as a semiconductor device, chip component, etc. Circuit boards 1, 38 are provided at the surface mounted with the electronic component with resin layer 39 (first resin layer) and resin layer 40 (second resin layer), respectively, covering electronic components 2a, 2b. Each of the resin layers consists of filler resin part 41, 42 for covering electronic component 2a, 2b, and resin/base-material composite part 43, 44 for covering filler resin part 41, 42. An epoxy resin is used for filler resin part 41, 42, while resin/base-material composite part 43, 44 is an alternate lamination of epoxy resin and glass cloth which is the base material. Thus resin layer 39, 40 is formed of filler resin part 41, 42 covering the electronic component and resin/base-material composite part 43, 44.

Circuit board 1, 38 is made of a substrate which consists of a glass cloth as the base material and an epoxy resin. Namely, modules 32, 33 are formed at the top and bottom surfaces with those layers containing a base material; which brings about an advantage of an increased bending strength with modules 32, 33. In addition, since a glass cloth, or the base material, has a small coefficient of linear expansion, a finished multilayer module would exhibit least warp.

Conductor patterns 34 and 35 are formed on the surface of resin/base-material composites 43 and 44, respectively. While, conductor pattern 5 (second conductor layer) and conductor pattern 45 (fourth conductor pattern) are formed on the other surfaces of circuit boards 1 and 38, respectively, viz. the surface that is opposite to resin layer 39, 40. Conductor pattern 34 and conductor pattern 5 are connected by through hole 46, while conductor pattern 35 is connected with conductor pattern 45 by through hole 47 (connection conductor).

It is preferred to provide both of through holes 46 and 47 in resin/base-material composite parts 43, 44, because glass cloth's coefficient of linear expansion is smaller that that of epoxy resin. Namely, through hole 46, 47 formed in resin/base-material composite part 43, 44 which contains a glass cloth as the base material, exhibits a smaller expansion/contraction due to thermal change. As a consequence, through hole 46, 47 will have a smaller possibility of damages of crack etc. due to thermal change. So, the multilayer modules would offer a high reliability.

Next, conductor pattern 45 is mounted with electronic component 2c (third electronic component), and metal cover 48 is attached to cover electronic component 2c. This completes a finished multilayer module 31.

Module 33 contains electronic component 2b. In addition, electronic component 2c can be mounted on module 33. So, a multilayer module in accordance with the first embodiment has a 3-layer structure that can be implemented in a small size.

In the above-described structure, through hole 46 is formed penetrating only module 32. Conductor pattern 34 and conductor pattern 35 are disposed such that they oppose each other, and insulation layer 36 is provided in between these conductor patterns.

In module 33, through hole 47 connects conductor pattern 35 and electronic component 2b. Thus, the location of through hole 47 in module 33 is not restricted by a location of through hole 46 of module 32. Consequently, a restricted area in which no electronic component 2b can be mounted due to the location of through hole 46 can be reduced, and electronic component 2b can be mounted at high density. So, multilayer modules 31 may be implemented in smaller sizes.

Since both of conductive bond 87 and insulation layer 36 have the thermosetting property, they do not melt with a heat generated when module 31 is soldered on a mother board, etc. Module 32 and module 33 would not become separated apart. So, the interconnection reliability among the circuits of modules 32, 33 will be increased.

Through hole 46 is formed in a semi-circle shape at a side of module 32. This facilitates an efficient layout arrangement for electronic components 2a in the central area of circuit board 1. Furthermore, through hole 46 can be used also as a terminal for mounting multilayer module 31; which enables the space to be used efficiently and makes a multilayer module 31 smaller in size.

Now in the following a method of manufacturing multilayer module 31 is described referring to the drawings.

Figure 2:
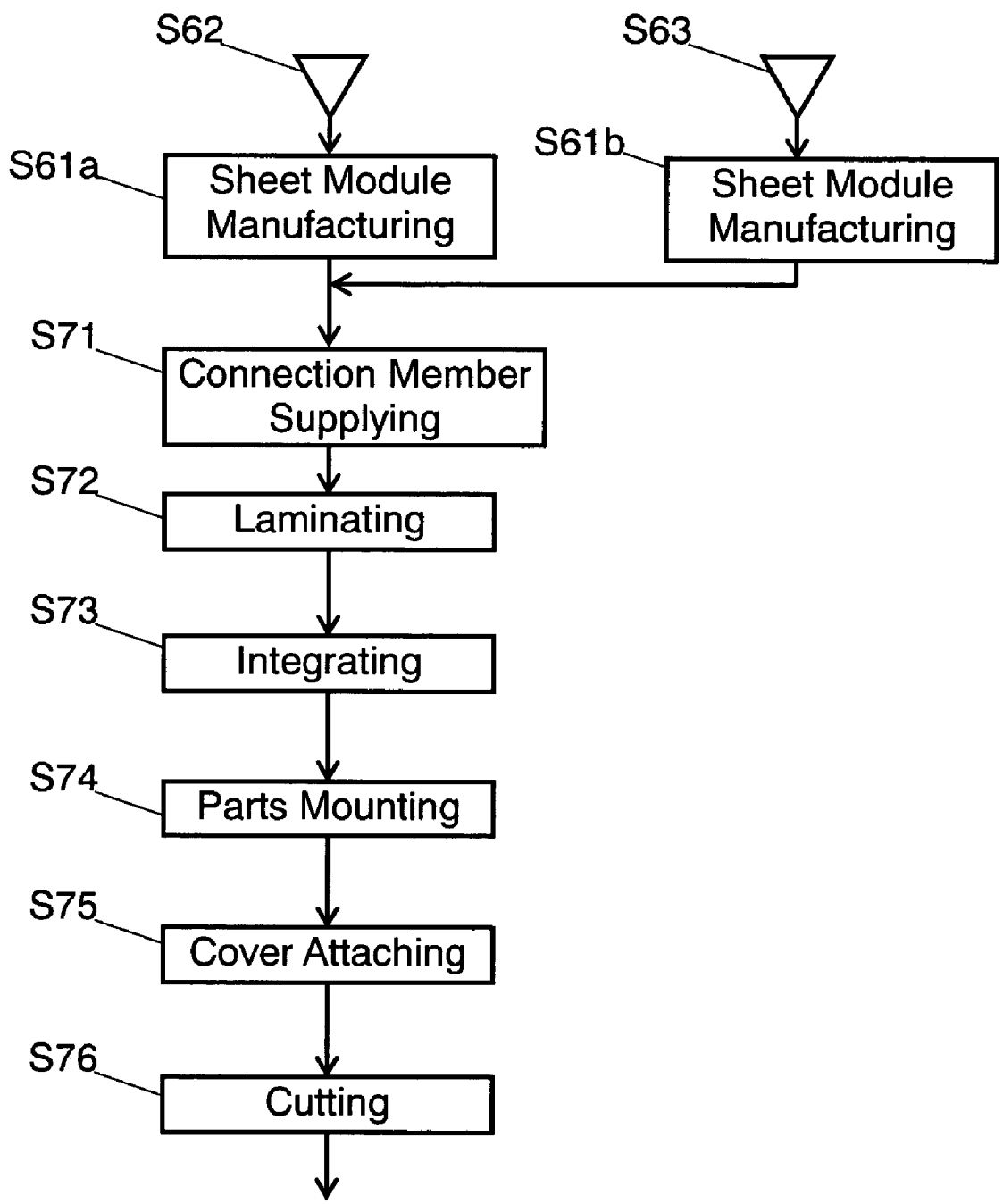
FIG. 2 A production flow chart of a multilayer module in the first embodiment.
Figure 3:
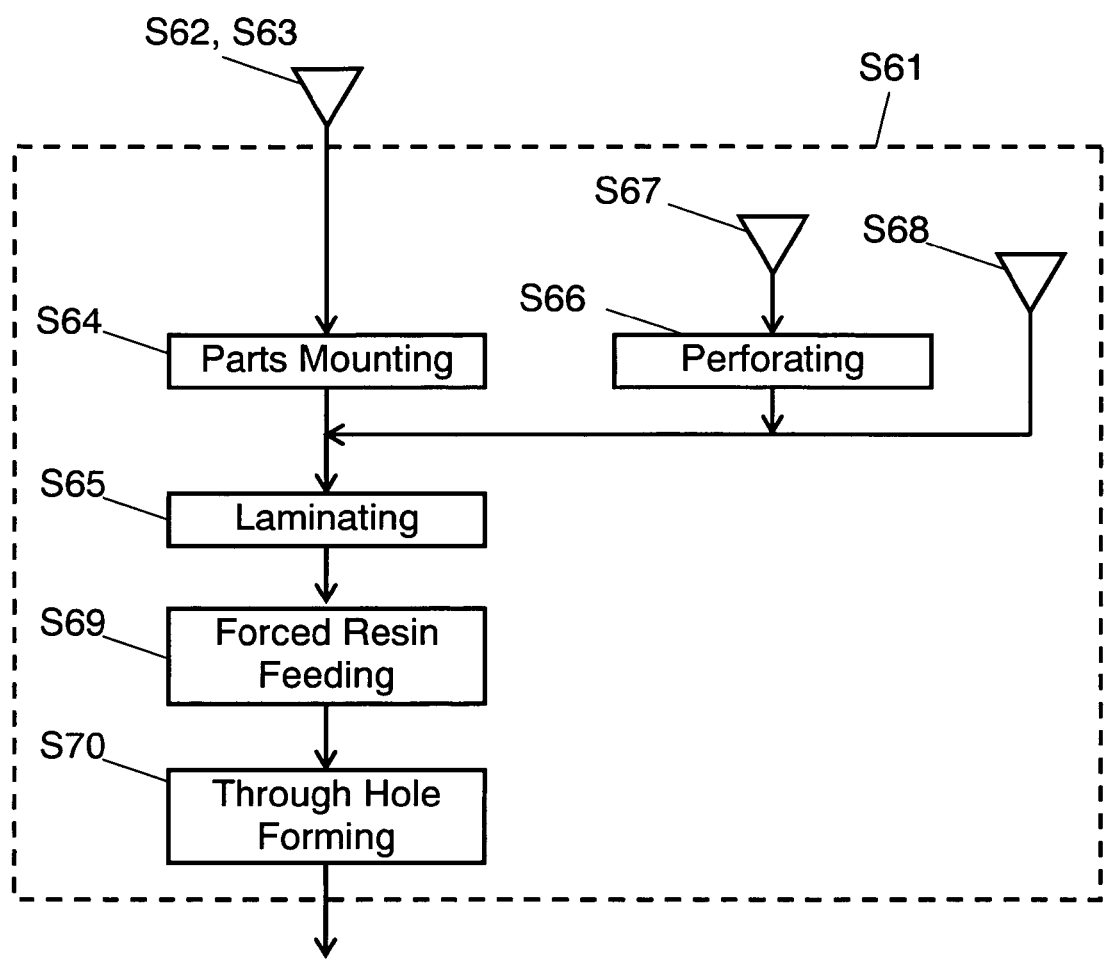
FIG. 3 A production flow chart of a sheet module for use in multilayer modules of the first embodiment.
Figure 4:
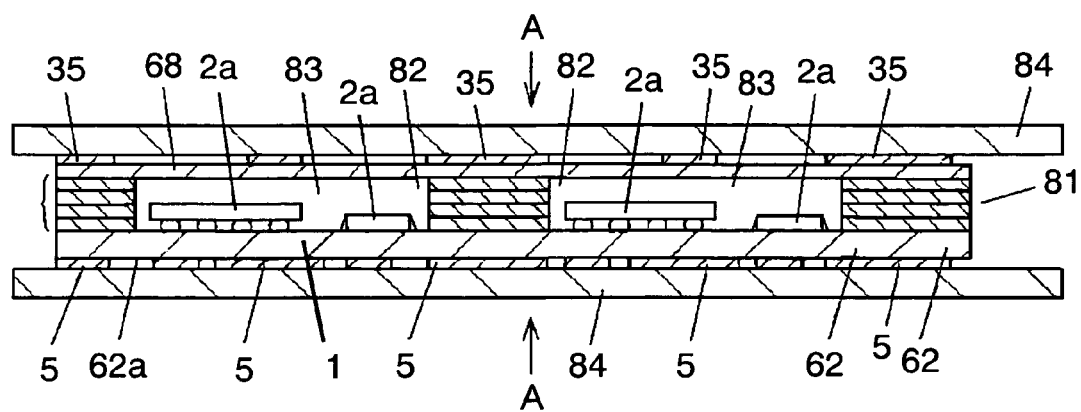
FIG. 4 A cross sectional view of a sheet module for use in multilayer modules of the first embodiment, showing a state at the integrating step.

FIG. 2 is a production flow chart showing a process of manufacturing multilayer module 31 in accordance with a first embodiment of the present invention. FIG. 3 is a production flow chart showing a process of manufacturing sheet module 81 (ref. FIG. 4) used in multilayer module 31 of the present invention. FIG. 4 is a cross sectional view of sheet module 81 at the integrating step.

Sheet module manufacturing step S61 in FIG. 3 is a step of manufacturing sheet module 81 (shown in FIG. 4), which sheet module having a plurality of modules 32, or modules 33, connected.

Sheet module manufacturing step S61 is described in detail, using sheet module manufacturing step S61a as example. Reference is made to FIG. 2, FIG. 3 and FIG. 4; at sheet module manufacturing step S61a, electronic component 2a is mounted on sheet substrate 62, which sheet substrate being a plurality of circuit boards 1 connected, viz. parts mounting step S64. Here, electronic component 2a is reflow-soldered using a cream solder, or the like, of high melting point. IC (Integrated Circuits) chip or the like parts are mounted flip-chip on circuit board 1 with the face down. Sheet substrate 62 has already been provided with conductor pattern 5 formed on bottom surface 62a.

Laminating step S65 comes after parts mounting step S64. Here, prepreg 67 (an example of resin sheet) is stacked on sheet substrate 62 for four sheets at the electronic component 2a mounting side, which prepreg being provided beforehand at perforating step S66 with opening 82 corresponding to electronic component 2a. Circuit substrate 68 (cured) having conductor pattern 35 formed thereon is disposed on prepreg 67 with conductor pattern 35 facing outward. The thickness of four prepregs 67 laminated is greater than the height of electronic component 2a. Opening 82 has a size that is greater than the outer dimensions of electronic component 2a, for facilitating easy stacking operation of prepreg 67. As a result, empty space 83 is formed at the top and the sides of electronic component 2a.

Forced resin feeding step S69 comes after laminating step S65. Here, sheet substrate 62, prepregs 67 and circuit substrate 68 laminated thereon are disposed as they are between platens 84. Then as shown in FIG. 4, they are compressed with heat in the direction A.

Prepreg 67 has been impregnated with a thermosetting epoxy resin. An epoxy resin used in the present embodiment stays in a sheet form state up to approximately 90° C. from the normal room temperature (first temperature range). Along with the increasing temperature, viscosity of the resin goes lower and starts becoming fluid. The pressing force given by platen 84 in the present embodiment is approximately 40 kg/cm$^2$; with this pressure the epoxy resin becomes fluid in a temperature range from approximately 90° C. to approximately 150° C. (second temperature range). When the temperature goes higher than 150° C., it is cured. The viscosity of epoxy resin changes depending on heating conditions, too. The fluidity starting temperature is also influenced by a pressing force of platen 84. Therefore, it is not necessary to limit the characteristics of an epoxy resin as above-described, but different conditions may be established for forced resin feeding step S69, taking properties of facilities and a resin into consideration.

As described in the above, by compressing prepreg 67 with pressing force 40 kg/cm$^2$ at forced resin feeding step S69, the epoxy resin which becomes fluid at a temperature higher than 90° C. lower than 150° C. is introduced forcedly into empty space 83. After the empty space is thoroughly filled with the resin, it is cooled. Then, filler resin part 41 is formed to complete finished resin layer 39 having a built-in electronic component. In this way, narrow gaps between electronic component 2a and circuit board 1 are filled completely with resin. Therefore, it is not necessary to provide beforehand an intermediary material (under-fill) or the like item between electronic component 2a and circuit board 1.

Resin layer 39 (ref. FIG. 1) exhibits thermal contraction during cooling. By disposing resin layer 39 in between cured circuit substrate 68 and circuit board 1, a warp due to the contraction of resin layer can be made smaller. So, it is advantageous to make the thicknesses of circuit substrate 68 and circuit board 1 to be identical.

At through hole forming step S70, which follows forced resin feeding step S69, through hole 46 is formed for connecting conductor pattern 34 and conductor pattern 5.

After these steps, a finished sheet module 81 is completed. Although the descriptions have been made regarding the manufacture of sheet module 81 which is a plurality of modules 32 connected, sheet module having a plurality of modules 33 connected can be provided through the same process steps as sheet module 81. Modules 32 and 33 are thus completed as the finished modules which contain built-in parts.

Now, reference is made to FIG. 2. At connection member supplying step S71, conductive bond 37 is supplied onto connection terminals 34a, 34b of sheet module 81 manufactured at step S61a. In the present embodiment, uncured prepreg is perforated at the places corresponding to connection terminals 34a, 34b, 35a and 35b, and the perforations are filled with a conductive paste. By laminating the uncured prepreg on upper surface 32a of module 32, conductive bond 37 is supplied to connection terminals 34a and 34b, at the same time a resin is supplied for forming insulation layer 36. The uncured prepreg is made of a glass base-material impregnated with an epoxy resin.

At lamination step S72, which comes after connection member supplying step S71, module 33 in a sheet form is laminated on uncured prepreg. Module 38 is disposed such that module 32's resin layer 39 and module 33's resin layer 40 oppose each other.

At integrating step S73, the uncured prepreg after laminating step S72 is heated for curing. Insulation layer 33 is thus formed between module 32 and module 33, and sheet-formed module 32 and sheet-formed module 33 are integrated into a single substance. At the same time, conductive bond 37 is also cured to connect connection terminals 34a, 34b with respective connection terminals 35a, 35b.

Resin layer 39 contracts during cooling at sheet module manufacturing step S61. So, warp tends to occur at the resin layer 39 side. Therefore, module 33 in the present first embodiment is disposed such that resin layer 39 opposes resin layer 40, in order to have the warp compensated to each other. Namely, module 32 and module 33 are laminated so that their directions of warp are opposite. By so doing, module 32 warps to a direction which is opposite to that of module 33. After they are integrated, respective warps set off to each other, and an eventual warp of a sheet module can be made smaller.

In addition, it is prepared to make the thicknesses of resin layers 39 and 40 of modules 32 and 33 to be identical. This is because a quantity of warp with modules 32, 33 increases in proportion to a thickness of the resin layer. Their warp quantities can be made to be identical by making resin layer 39 and resin layer 40 to have the same thickness. By so doing, warp of a module after integration becomes smaller; so, it turns out to be possible to mount additional electronic components on a module in sheet form. Thus, a module can be mounted as it is in a sheet form with an electronic component, which means that the multilayer modules can be manufactured at high productivity.

At integrating step S73, it is pressed and heated in the same manner as in forced resin feeding step S69. Therefore, a warp with sheet module caused by thermal contraction of resin layer during cooling can be further corrected. Furthermore, since space between module 32 and module 33 is thoroughly filled with an epoxy resin leaving no void by the pressure, the connection strength between module 32 and module 33 becomes stronger.

The processing at integrating step S73 can be worked out using the production facilities used in forced resin feeding step S69. No dedicated facility is needed for integrating step S73. The saving in facility investment is advantageous for manufacturing the multilayer modules at lower cost.

The uncured prepreg contains at the center a glass cloth of approximately 80 micrometer. So, insulation layer 36 can hardly be compressed to be thinner than a thickness of the glass cloth, despite the pressure at integrating step S73. Therefore, insulation layer 36 can be formed without fail.

Figure 5:
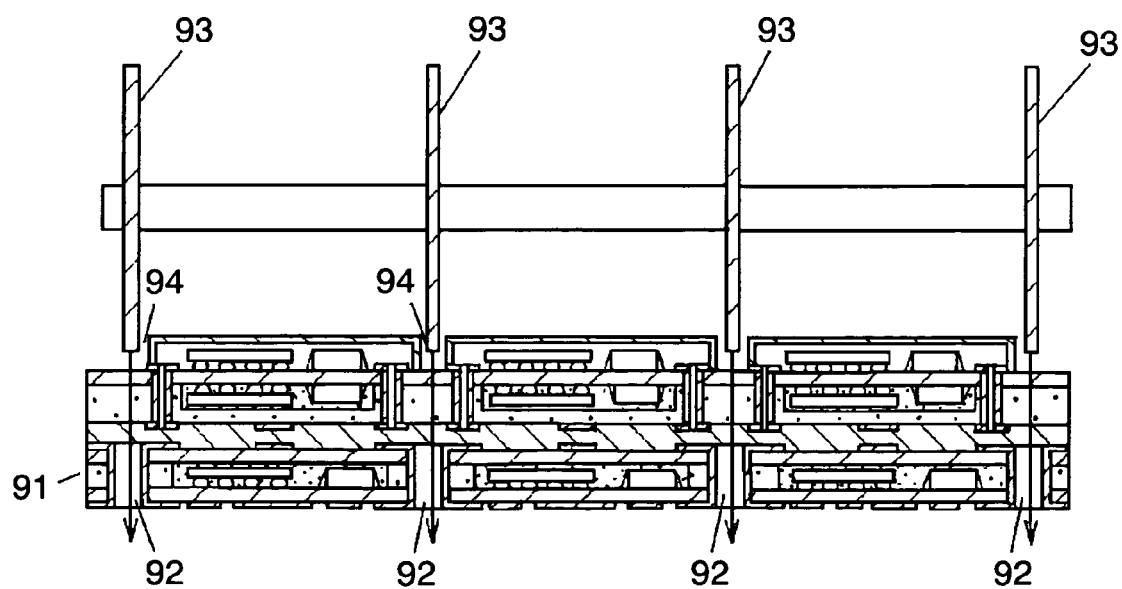
FIG. 5 A cross sectional view of a sheet module for use in multilayer module of the first embodiment, showing a state at the cutting step.

FIG. 5 is a cross sectional view of a sheet module for manufacturing multilayer modules in accordance with first embodiment of the present invention; the sheet module is shown at cutting step. Laminate sheet module 91, or an integration of module 32 in sheet form and module 33 in sheet form, is provided through a series of the earlier-described processing steps.

At parts mounting step S74, electronic component 2c is mounted on conductor pattern 45 (ref. FIG. 1) of laminate sheet module 91. The mounting of electronic component 2c is made by using a solder whose melting point is lower than that of the solder used at parts mounting step S64. This is because of a consideration for preventing a possible short circuit trouble within resin layers 39, 40, which might be caused by a solder contained in module 32, 33 melted again by a reflow heat at parts mounting step S74.

At cover attaching step S75, which comes after parts mounting step S74, cover 48 (ref. FIG. 1) is attached on laminate sheet module 91 at the surface where electronic component 2c has been mounted, and the cover is soldered.

At cutting step S76, laminate sheet module 91 is cut at boundary section 92 into individual pieces using cutting teeth 93 disposed at an interval of boundary section 92, as shown in FIG. 5. Modules 32, 33 and insulation layer 36 are cut altogether at once; so, the cut-end faces of module 32 and module 33 are on a straight line. Therefore, the productivity is high and provides stable outer dimensions.

Because the sheet module is cut at the boundary section while it has covers 48 attached thereon, it is essential to provide clearance 94 between the outer contour of cover 48 and cutting teeth 93 such that the cover is not damaged by the cutting teeth. The outer size of cover 48 has to be smaller than the cross sectional width of a module (ref. FIG. 1).

It is preferred to pay a precaution so that conductive bond 37 (ref. FIG. 1) is not cut at cutting step S76. Namely, connection terminals 34a, 35a, 34b, 35b should be located inwardly of cut-end face 49, in order that the cut-end face always reveals insulation layer 36 formed between module 32 and module 33. By so arranging, the possible peel-off of conductive bond 37 due to stress of cutting can be reduced.

In a method of manufacturing multilayer module 31 in accordance with the first embodiment of the present invention, a plurality of sheet modules are manufactured beforehand at sheet module manufacturing step S61. And then, after connection member supplying step S71, module 32 and module 33 are stacked with an insulation layer in between; module 32 and module 33 are integrated in the laminated state. By so doing, the location of through hole 47 in module 33 is not restricted by a place of through hole 46 of module 32. Consequently, a restricted area in which no electronic component 2b can be mounted due to the location of through hole 46 can be reduced, and electronic component 2b can be mounted at high density. So, multilayer modules 31 may be implemented in smaller sizes.

A plurality of sheet modules manufactured at sheet module manufacturing step S61 are integrated with an insulation layer in between, and then the integrated substance is cut into individual pieces. A step for forming resin layer 39, 40 exists one for each module, and modules 32, 33 manufactured separately can be integrated altogether at one operation. So, the warp due to thermal contraction of resin layer 39, 40 is not accumulated in stacking the modules into a multilayered state. Therefore, the increase of warp in proportion to an increasing number of stacking, which is observed among conventional multilayer modules, can be reduced.

Insulation layer 36 in the first embodiment is formed of a single sheet of prepreg; so, the thickness of insulation layer 36 is thinner as compared to that of module 32, 33. Therefore, the warp of multilayer module 31 due to thermal contraction during curing of the uncured prepreg at integrating step S73 can be made smaller. The same advantage is obtainable when providing multilayer modules having three or more number of modules stacked, details of which will come later.

Although multilayer module 31 in the present embodiment has two modules stacked, the module may be stacked for three or more numbers.

Figure 6:
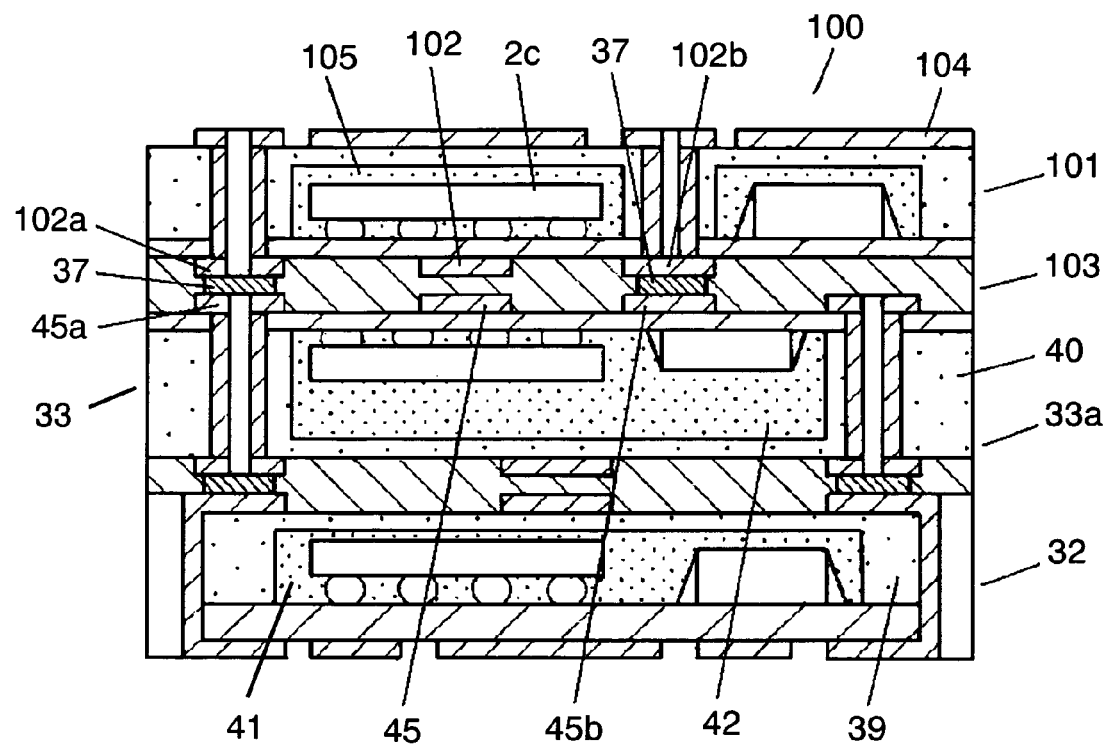
FIG. 6 A cross sectional view of a multilayer module having three stacked modules in the first embodiment.

FIG. 6 is a cross sectional view of multilayer module 100 in which three modules are stacked. In multilayer module 100, connection terminals 45a, 45b are formed also on conductor pattern 45 of module 33a. These connection terminals 45a, 45b are connected via conductive bond 37 with connection terminals 102a, 102b disposed on the bottom surface of module 101. These modules 32, 33a and 101 are integrated in a state where insulation layer 103 is provided between conductor pattern 102 formed at the bottom surface of module 101 and conductor pattern 45.

In the same way as modules 32, 33a, module 101 is manufactured at sheet module manufacturing step S61 in the form of a sheet module having built-in electronic component 2c.

The point of difference in multilayer module 100 manufacturing method as compared with multilayer module 31 manufacturing method is that at connection member supplying step S71 of FIG. 2, an uncured prepreg is stacked also on the upper surface of module 33a. The uncured prepreg is provided with perforations at places corresponding to connection terminals 45a, 45b, 102a, 102b; and the perforations are filled with conductive bond 37.

These three modules 32, 33a and 101 are laminated at laminating step S72, and they are compressed and heated altogether at integrating step S73.

As described in the above, the resin layer forming step is once for each of the modules even in a multilayer module containing three or more layers of modules stacked. These separately-manufactured modules are integrated simultaneously at a single heat-pressing step. Therefore, the warp due to thermal contraction of resin layers is not accumulated even in a multilayer module of three or more layers. Thus the warp of multilayer module can be reduced to the smallest.

In a case where a multilayer module is formed by laminating parts-containing modules for an even number, among other cases, it is preferred to make the number of those parts-containing modules disposed with the resin layer up (forward direction) and those disposed with the resin layer down (reverse direction) the same. Because modules disposed in the forward direction exhibit a warp direction that is opposite to that of modules disposed in the reverse direction, the warp of a multilayer module which is an integrated body of these modules can be the smallest.

Furthermore, it is preferred to make a gross thickness of resin layers in modules disposed in the forward direction and that of those modules disposed in the reverse direction to be substantially identical. This is for reducing the warp quantity of multilayer module 100 after the integrating step. What is especially important is to make thicknesses of filler resin parts 41 and 42 to be identical, which parts of resin layers 39 and 40 playing the key role with respect to warp. Therefore, in multilayer module 100 in FIG. 6 for example, the gross thickness of filler resin parts 41 and 105 in the forward direction modules 32 and 101 is made to be identical with the thickness of filler resin part 42 of module 33.

Still further, the multilayer module shown in FIG. 6 is provided with ground pattern 104 at the upper surface of the uppermost module 101. When the above multilayer module 100 is used for a high frequency application, for example, ground pattern 104 at the uppermost layer can shield high frequency signals. This enables the elimination of cover 48 itself and step S75 for attaching it. Thus, low-cost high frequency modules can be offered.

Although a conductive resin is supplied as a connection member on module 32 at connection member supplying step S71 (ref. FIG. 2) in the present embodiment, a cream solder may be used instead.

Figure 7:
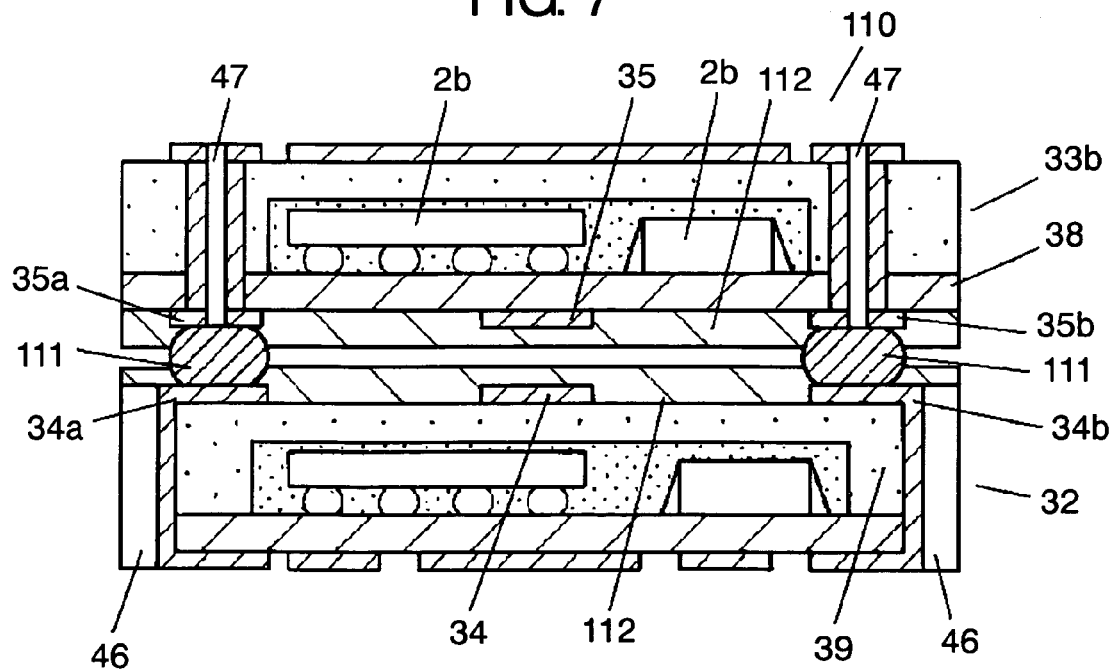
FIG. 7 A cross sectional view of a multilayer module in the first embodiment, in which a cream solder is used for the connection member.

FIG. 7 is a cross sectional view of multilayer module 110 in which a cream solder is used for the connection member. Referring to FIG. 7, connection terminals 34a, 34b of module 32 are connected by means of cream solder 111 with connection terminals 35a, 35b, respectively, of module 33b which contains built-in parts. Thus, even when cream solder 111 is used, the location of through hole 47 in module 33 is not restricted by a location of through hole 46 of module 32. The restricted area in which no electronic component 2b can be mounted due to the existence of through hole 46 can be made smaller. This enables a high density mounting of electronic components 2b; hence, multilayer module 110 can be reduced in the size.

When connecting module 32 and module 33b by means of cream solder 111, it is preferred to dispose the modules so that module 33b's circuit board 38 opposes to module 32's resin layer 39. When laminating these modules thus disposed, a warp direction of module 32 coincides with that of module 33b; therefore, at integrating step S73, there is no need of compressing them by means of platen, etc. So, at integrating step S73, multilayer module 110 can be integrated with ease using a generally used reflow furnace.

Furthermore, it becomes possible to supply a connection member on connection terminals 34a, 34b by making use of screen printing or other such processes. As a result, a perforating operation and a step of filling the perforation with conductive bond 37 can be eliminated; so the multilayer modules can be manufactured at high productivity. Still further, an insulation means can be provided with ease by applying solder resist 112 (which being an example of insulation layer) on the surface where module 32 and module 33 oppose to each other.

Figure 8:
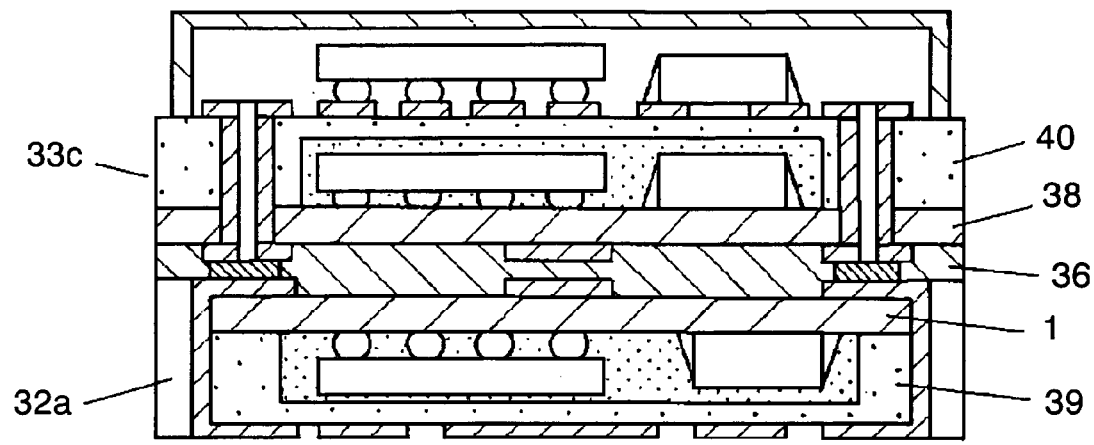
FIG. 8 A cross sectional view of a multilayer module in the first embodiment, in which the modules are stacked such that the circuit boards are disposed face to face.

FIG. 8 is a cross sectional view of a multilayer module where the modules are laminated with their circuit boards opposing face to face. Although modules 32 and 33 in FIG. 1 are disposed such that resin layer 39 opposes resin layer 40, they may be disposed instead in another arrangement in which circuit board 1 opposes circuit board 38, as shown in FIG. 8. Also in the latter structure, the warp direction of module 32 and that of module 33 are opposite to each other, so the respective warps am set off after these modules are integrated. The multilayer modules thus structured would exhibit the smallest warp.

Second Exemplary Embodiment

A second embodiment of the present invention is described referring to the drawings.

Figure 9:
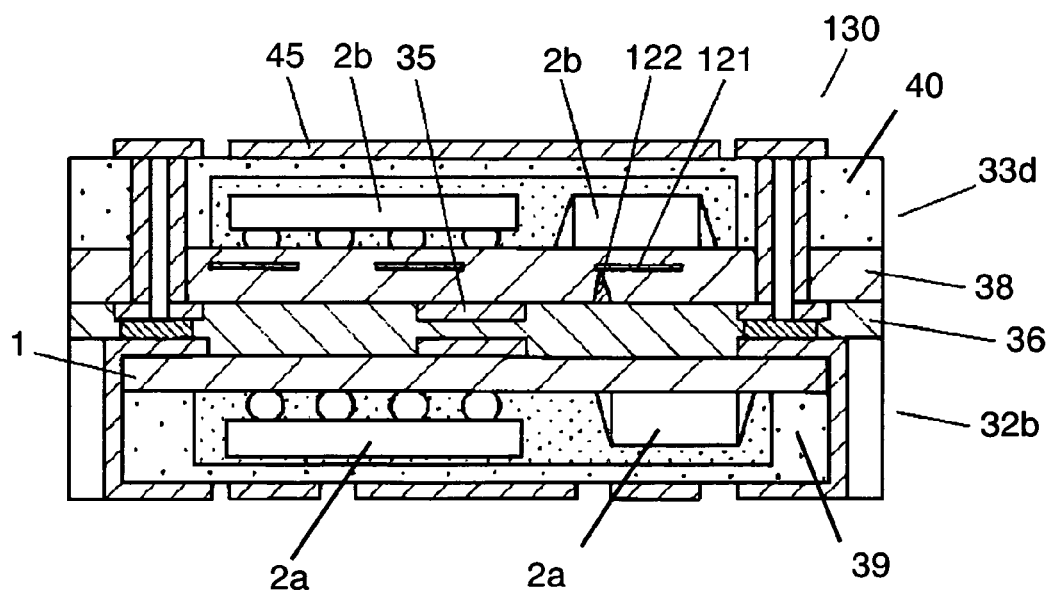
FIG. 9 A cross sectional view of a multilayer module in accordance with a second exemplary embodiment of the present invention.

FIG. 9 is a cross sectional view of a multilayer module in accordance with a second embodiment. In FIG. 9, module 32b is a parts-containing module which contains a demodulation circuit, module 33d is a parts-containing module which contains a receiving circuit including oscillation circuit. Module 33d is stacked on module 32b to complete high frequency module 130. Inductor 121 which constitutes an oscillation circuit is formed with an inner layer pattern of circuit board 38. Inductor 121 and electronic component 2b build up an oscillation circuit, a receiving circuit, etc. Electronic components 2a, 2b are mounted on circuit boards 1, 38, respectively; these electronic components are included, respectively, as they are in resin layers 39, 40.

Figure 10:
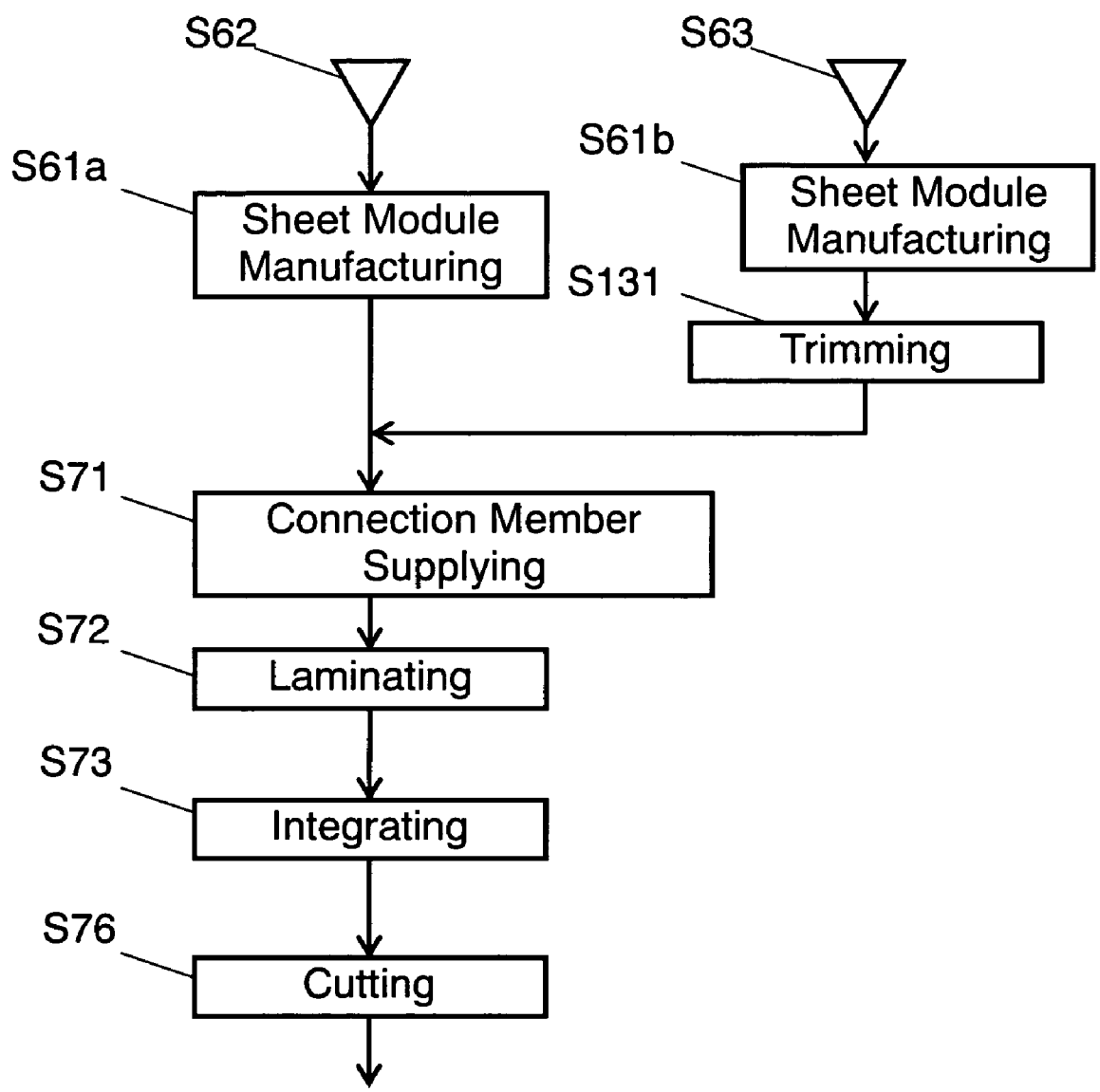
FIG. 10 A production flow chart of a multilayer module in the second embodiment.

FIG. 10 is a production flow chart of a multilayer module (high frequency module) in a second embodiment of the present invention. In FIG. 10, there is trimming step S131 between sheet module manufacturing step S61 and connection member supply step S71. At trimming step S131, a laser beam trimming is made from the reverse side (the surface having conductor pattern 35) to adjust inductor 121's inductance value, and bring oscillation frequency of the oscillation circuit to a specified value.

At laminating step S72, module 33*d* is stacked so that the circuit board 38 side comes to face insulation layer 36. By so doing, an epoxy resin contained in uncured prepreg melts down at integrating step S73 and flows into adjusting hole 122. The adjusting hole is thus filled with the epoxy resin and sealed. So, oscillation frequency of the oscillation circuit does not shift easily, which would stay stable for a long time without being affected by humidity or other factors.

Furthermore, conductor pattern 45 on module 33*d* in second embodiment is grounded. So, there is no need of providing a separate cover, and cost of the multilayer module can be reduced.

Third Exemplary Embodiment

A third exemplary embodiment is described referring to the drawing.

Figure 11:
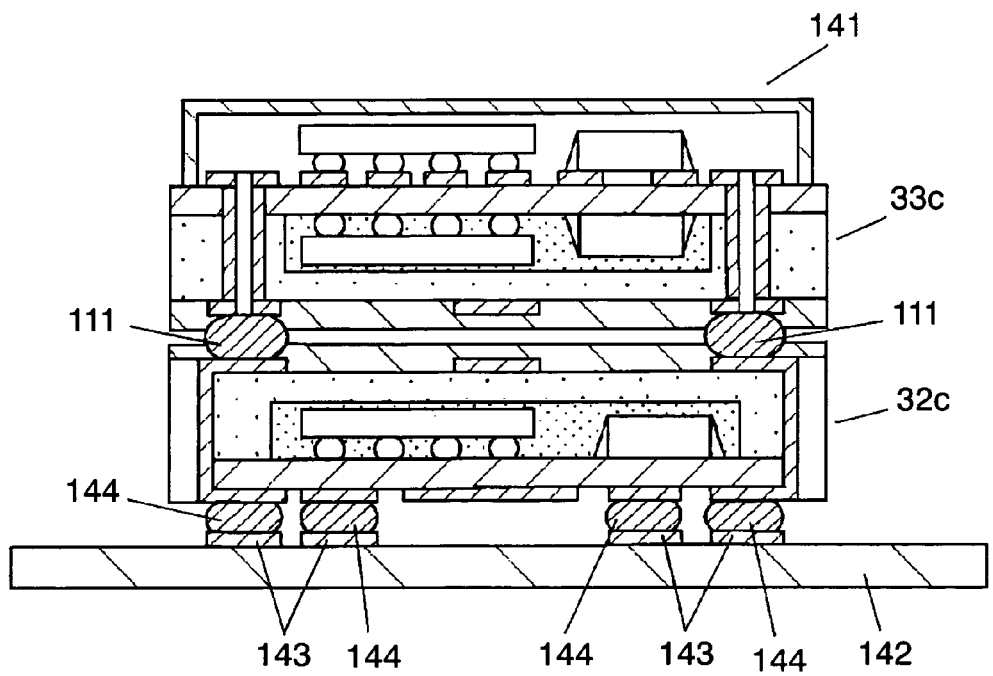
FIG. 11 A cross sectional view of a multilayer module in accordance with a third exemplary embodiment of the present invention, shown in a state where it is mounted on a mother substrate.
Figure 12:
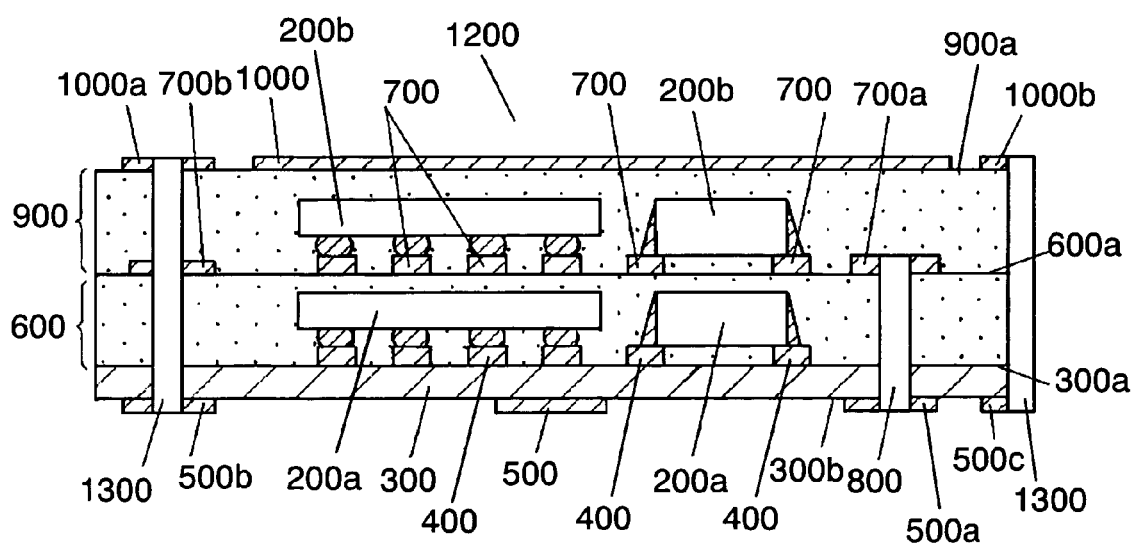
FIG. 12 A cross sectional view of a conventional multilayer module.
Figure 13:
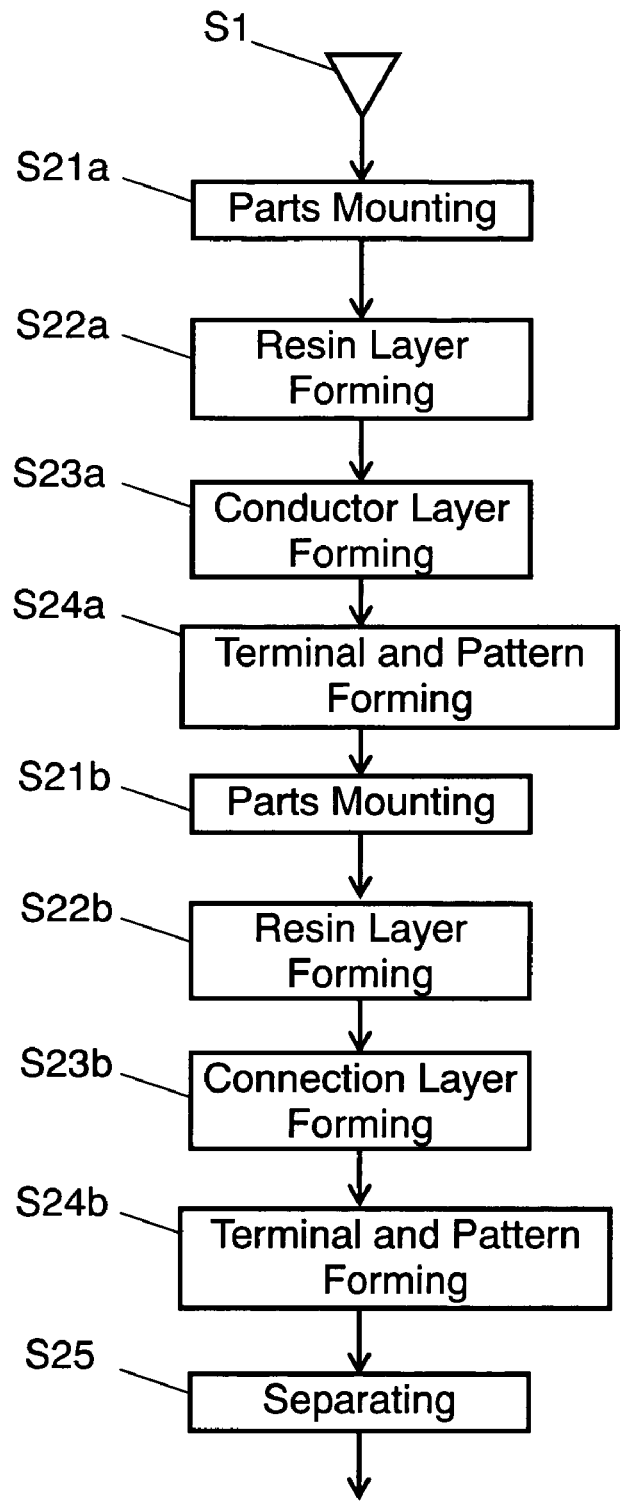
FIG. 13 A production flow chart of a conventional multilayer module.

FIG. 11 is a cross sectional view of a multilayer module mounted on a mother substrate in accordance with a third embodiment. In FIG. 11, cream solder 111 is used as the connection member between module 32*c* and module 33*c*. Multilayer module 141 is connected on mother substrate's conductor pattern 143 using also cream solder 144. What is important here is that cream solder 111 has a higher melting point than that of cream solder 144. In this configuration, cream solder 111 is not melted by the heat of reflow soldering generated when mounting multilayer module 141 on mother board 142. Cream solder 111 would not get damaged easily at reflow step for mother board 142. Thus, the multilayer module will exhibit a high reliability.

Furthermore, under the above-described structure, module 32*c* and module 33*c* can be laminated such that their warp directions are opposite to each other. In a case if cream solder 111 is melted at the reflow step of mother board 142, modules 32*c* and 33*c* tend to follow their intrinsic warp directions. Cream solder 111, however, does not melt; so the connection part is rarely hurt to disconnection. Also, warp of multilayer module 141 can be kept smaller.

INDUSTRIAL APPLICABILITY

A multilayer module in accordance with the present invention can make a multifunctional module smaller in size. This is a significant advantage for those modules mounted in portable apparatus, etc.

The invention claimed is:

1. A multilayer module comprising:
a first module having a first circuit board, a first electronic component mounted on one surface of the first circuit board, and a first resin layer formed on the one surface of the first circuit board so as to cover the first electronic component, wherein the first module further includes
a first conductor layer formed on a first surface of the first module,
a first connection terminal provided on the first conductor layer,
a second conductor layer formed on a second surface of the first module, and
a through hole for connecting the second conductor layer and the first conductor layer;
a second module stacked on the first module, the second module having a second circuit board and a second electronic component mounted on a first surface of the second circuit board, wherein the second module further includes
a third conductor layer arranged so as to oppose the first conductor layer,
a second connection terminal provided on the third conductor layer at a place which corresponds to the first connection terminal, and
a conductor provided for connection between the second connection terminal and the second electronic component;
an insulation layer formed between the first conductor layer and the third conductor layer; and
a connection member for connection between the first connection terminal and the second connection terminal,
wherein the first resin layer includes a filler resin part covering the first electronic component and a resin/base-material composite part covering the filler resin part,
and wherein an outer surface of the first resin layer is formed of the resin/base-material composite part, and a through hole is provided at the resin/base-material composite part.

2. The multilayer module of claim 1, wherein the connection member is a thermosetting conductive bond.

3. The multilayer module of claim 1, wherein the insulation layer is a thermosetting resin.

4. The multilayer module of claim 3, wherein the second module further includes
an oscillation circuit, and
an inductor constituting the oscillation circuit, wherein the third conductor layer is provided with an adjusting hole for trimming the inductor.

5. The multilayer module of claim 1, wherein the through hole has a semicircular shape provided at a side surface of the first module.

6. The multilayer module of claim 1, wherein an outer circumferential surface reveals the insulation layer at a boundary between the first module and the second module.

7. The multilayer module of claim 1, wherein the insulation layer is a solder resist, and the connection member is a cream solder.

8. The multilayer module of claim 7, wherein warp quantities of the first module and the second module are identical to each other.

9. The multilayer module of claim 7, wherein a melting point of the cream solder is higher than that of a cream solder used for connecting the multilayer module to a mother board.

10. The multilayer module of claim 9, wherein warp directions of the first module and the second module are reversed.

11. The multilayer module of claim 1, wherein an outer circumference of the first module and the second module have respective cut-end faces aligned on a straight line.

12. A method of manufacturing a multilayer module according to claim 11, comprising:
supplying the connection member on the first connection terminal, wherein the first module comprises a first sheet module, the first sheet module being a plurality of first modules connected,
laminating the second module so that the second connection terminal corresponds to the connection member, wherein the second module comprises a second sheet module, the second sheet module being a plurality of second modules connected,
integrating a laminated body of the first module, the connection member and the second module with heat and pressure, and cutting the first module and the second module at a connecting section.

13. The method of claim 12, wherein the supplying of the connection member comprises:
 connecting a plurality of circuit boards in the first sheet module;
 mounting an electronic component on one surface of each of the circuit boards;
 forming the first resin layer to cover the electronic component mounted on the surface of each of the circuit boards;
 providing the second connection terminal on the first resin layer; and
 connecting the first conductor layer and the second conductor layer via a through hole.

14. The method of claim 13, wherein the supplying of the connection member further comprises:
 forming an opening corresponding to a location of the first electronic component mounted on the surface of each of the circuit boards; and
 laminating a resin sheet made of a thermosetting resin.

15. The method of claim 14, wherein the laminating of the resin comprises:
 melting the resin by raising a temperature of the resin sheet to a second temperature range, the resin being a thermosetting resin which stays in a sheet form in a first temperature range, and which exhibits a thermal fluidity in the second temperature range which is higher than the first temperature range and is cured at a third temperature range which is higher than the second temperature range;
 filling the opening with resin by applying a pressure to the resin sheet before the temperature reaches the third temperature range so that the resin sheet is forced to flow into the opening; and
 raising the temperature up to the third temperature range.

16. The method of claim 14, wherein the laminating of the resin comprises:
 stacking a cured substrate having the second connection terminal on a laminated body which contains the circuit boards and the resin sheet, with the second connection terminal being arranged on an upper surface of the cured substrate.

17. The method of claim 13, further comprising:
 attaching a cover for covering a third electronic component mounted on a second surface of the second circuit board.

18. The method of claim 13, wherein one of the first module and the second module includes an oscillator, the method further comprising:
 adjusting an oscillation frequency of the oscillator by trimming an oscillation inductor constituting the oscillator.

19. The method of claim 13, wherein the supplying of the connection member further comprises:
 stacking a thermosetting conductive resin prepreg on the first module, the prepreg having the connection member in a hole provided at a place corresponding to the second connection terminal.

20. The method of claim 12, wherein a module having built-in parts is disposed beneath the first module, the method further comprising:
 connecting the module having built-in parts with the first module, and connecting the first module with the second module simultaneously.

21. The method of claim 20, wherein
 the supplying of the connection member includes delivering the connection member to an upper surface of the module having built-in parts,
 the laminating of the second module includes disposing the connection member to be sandwiched between the first module and the module having built-in parts in order to form a laminated body of the first module, the second module and the module having built-in parts, and
 the integrating of the laminated body includes heat-pressing the laminated body and the module having built-in parts simultaneously.

* * * * *